United States Patent [19]

Gleixner et al.

[11] Patent Number: 5,306,704
[45] Date of Patent: Apr. 26, 1994

[54] EFFICIENT INCORPORATION OF SILVER TO IMPROVE SUPERCONDUCTING FIBERS

[75] Inventors: Richard A. Gleixner, North Canton; Dale F. LaCount, Alliance, both of Ohio; Douglas K. Finnemore, Ames, Iowa

[73] Assignee: The Babcock & Wilcox Company, New Orleans, La.

[21] Appl. No.: 922,128

[22] Filed: Jul. 29, 1992

[51] Int. Cl.$^5$ .......................... H01L 39/12; B29B 9/00
[52] U.S. Cl. .................................... 505/425; 264/12; 505/733; 505/740; 505/430
[58] Field of Search .................... 505/1, 739, 740, 782; 264/12, 332

[56] References Cited

U.S. PATENT DOCUMENTS

| | | | |
|---|---|---|---|
| 4,828,469 | 5/1989 | Righi | 425/7 |
| 5,047,391 | 9/1991 | Bock et al. | 505/1 |
| 5,118,662 | 6/1992 | Agostinelli et al. | 505/1 |
| 5,151,407 | 9/1992 | Provenzano et al. | 505/1 |
| 5,202,307 | 4/1993 | Hayashi | 505/1 |
| 5,215,961 | 6/1993 | Rayne et al. | 505/1 |

OTHER PUBLICATIONS

T. A. Miller et al., "Strain Tolerant Microfilamentary Conductors of $Bi_2Sr_2Ca_1Cu_2O_{8-\delta}$," Appl. Phys. Lett. 58(19), May 13, 1991 pp. 2159-2161.
Q. Li et al, "Strain Tolerance of $Bi_2Sr_2Ca_1Cu_2O_{8-\delta}Ag$ Composites At High Field," J. Appl. Phys., 70(8), Oct. 15, 1991, pp. 4392-4397.
Proposal for Fiberization of Superconducting Material, B&W Proposal No. R&D 91-027, Mar. 1, 1991.
Progress Report to Superconducting Technology Program for Electric Energy Systems, Washington, D.C., Jul. 30, 1991.
T. A. Miller, et al., "Microfilamentary Conductor Based on (Bi 2212)", IEEE Transactions on Magnetics, vol. 27, #2, Mar., 1991.
T. A. Miller, et al., "Crystallization of Amorphous Bi Cuprate Fibers to Superconducting $Bi_2Sr_2Ca_1Cu_2O_8$," Appl. Phys. Lett. 56(6) Feb. 5, 1990.
T. A. Miller et al., "Microfilamentary $Bi_2Sr_2Ca_1Cu_2O_8$ Fibers" Proceedings of the International Conference on Superconductivity, Bangalore, India.
J. Righi et al., "Gas Jet Fiberization of $Bi_2Sr_2Ca_1$-$Cu_2O_8$," High Temperature Superconducting Compounds II, TMS, Warrendale, Pa. 1990.
K. R. Jacobs et al, "Crystallization of $Bi_2Sr_2CaCu_2O_x$ Superconducting Filaments Produced by Gas Jet Fiberization", IEEE Transactions on Magnetics, vol. 27, #2, Mar. 1991.
J. Y. Hsiang and D. K. Finnemore, "Superconducting Critical Currents for Thick, Clean Superconductor-Normal-Metal-Superconductor Junctions" Phys. Rev. B, 22, pp. 154-163, Jul. 1, 1980.
A. Davidson et al., "Remnant Resistance in Tsuei's Composite Superconductors", IEE, MAG-II, #2, Mar. 2, 1975.

(List continued on next page.)

Primary Examiner—Jan H. Silbaugh
Assistant Examiner—Christopher A. Fiorilla
Attorney, Agent, or Firm—Daniel S. Kalka; Robert J. Edwards; Vytas R. Matas

[57] ABSTRACT

An improved method for the efficient incorporation of a metal such as silver in a superconducting material includes blending the metal with a high temperature superconductor or precursor powder and consolidating the same into pellets. The pellets are charged directly into a heating assembly where it is melted and heated sufficiently to a uniform temperature prior to fiberization. Droplets of the melted blend fall through a collar into a nozzle where they are subjected to a high velocity gas to break the melted material into ligaments which solidify into improved flexible fibers having the metal homogeneously dispersed therein. The flexible fibers are collected by directing means against a collection filter.

18 Claims, 9 Drawing Sheets

OTHER PUBLICATIONS

Y. Matsumoto, et al, "Origin of the Silver Doping Effects on Superconducting Oxide Ceramics," Appl. Phys. Lett. 56(16), 1585-1587, 1990.

K. Sato et al., "High Jc Silver Sheathed Bi-Based Superconducting Wires", IEEE Trans. Magn. MAG-27, 1231-1238, Mar., 1991.

Q. Li et al., "Robust Superconducting Tapes Based on $Bi_2Sr_2Ca_2Cu_3O_{10-\delta}$" App. Phys. Lett. 59(22), pp. 2895-2897, Nov. 25, 1991.

D. Shi, et al., "Crystallization of Metal-Oxide Glasses in Bi-Sr-Ca-Cu-O Systems", Phys. Rev. vol. 40, #4, pp. 2247-2253, Aug. 1989.

D. Shi, et al., "Formation of the 110-K Superconducting Phase Via the Amorphous State in the Bi-Sr-Ca-Cu-O System," Phy. Rev. B, vol. 39, #13, May 1989.

FLOW DIRECTION →

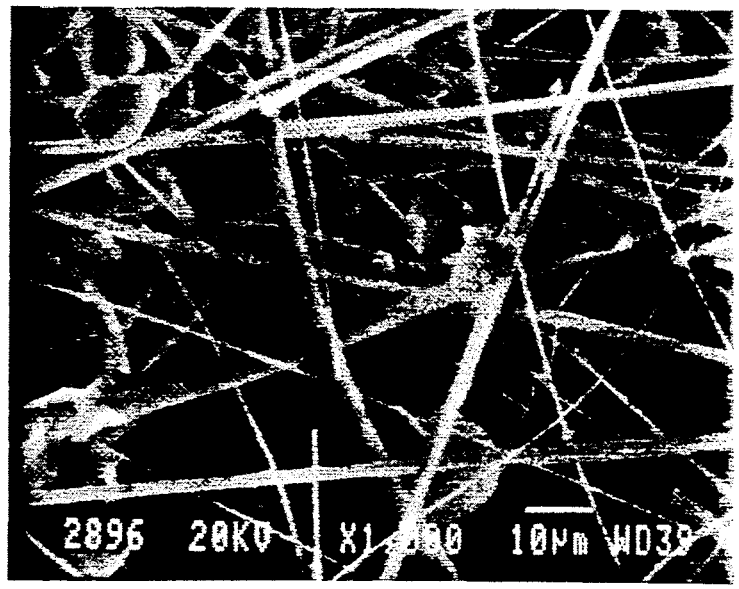
FIG.6     11.5 Wt.% Ag-2212 Fibers (1000X)
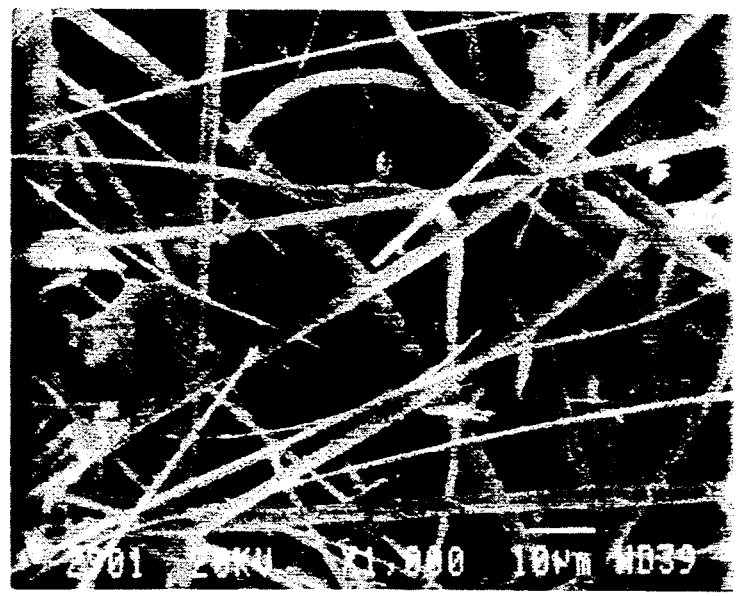
FIG.7     5 Wt.% Ag-2212 Fibers (1000X)

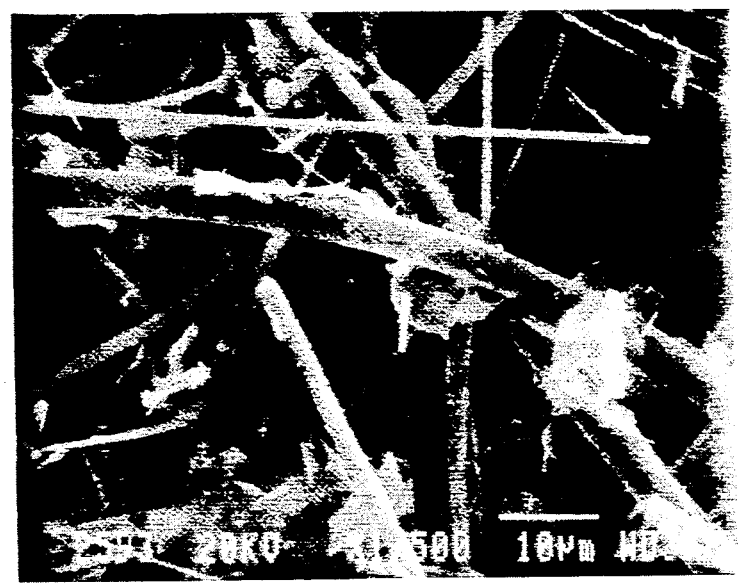
FIG. 8  23.5 Wt.% Ag-2212 Fibers Mixed With Silver-Rich Flakes (1500X).

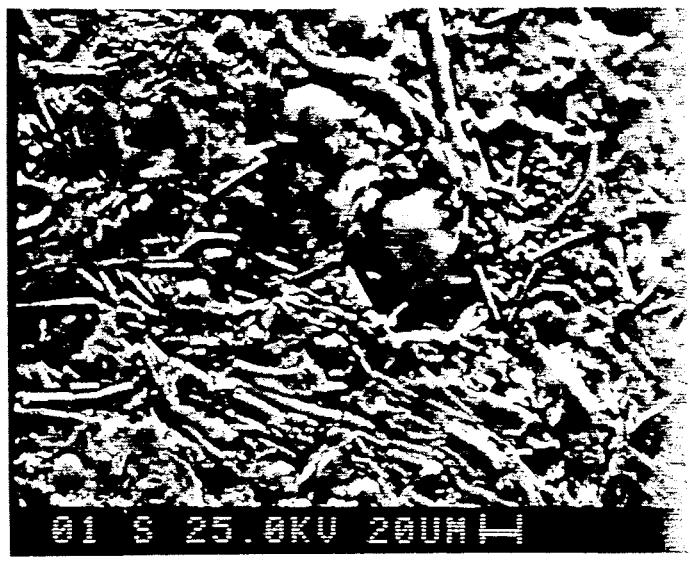
FIG. 9  Cold-Compacted 11.5 wt% Ag-2212 (300X)
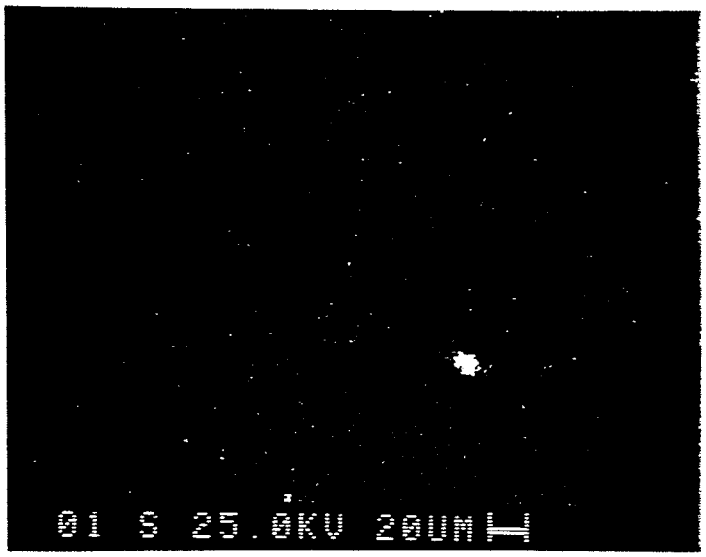
FIG. 10  X-Ray Dot Map for Silver

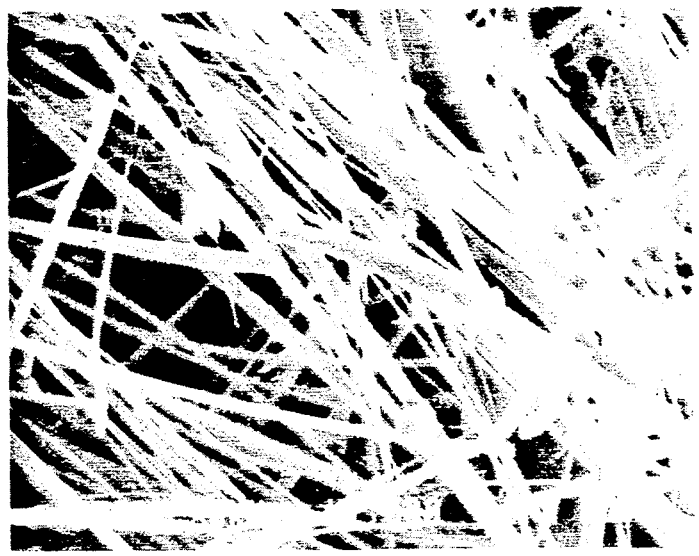
FIG. 11  Fibers Produced From Non-Calcined Precursor Containing 30 Wt.% Ag (1500X).
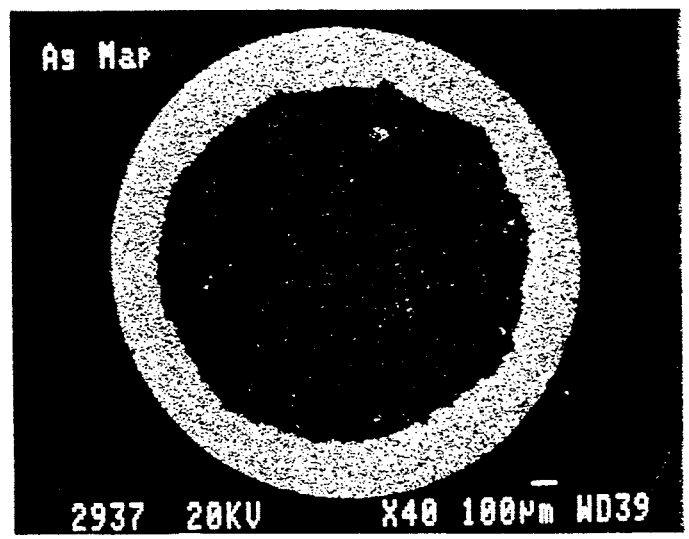
FIG. 12  EDS Map of Silver Distribution Within Composite (40X).

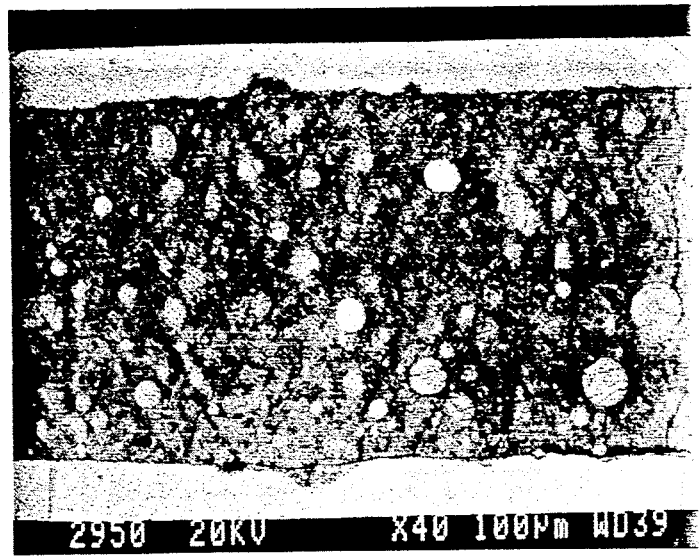
FIG. 13  Longitudinal Section of Fibrous Composite Manufactured From Run #106 Material (40X).
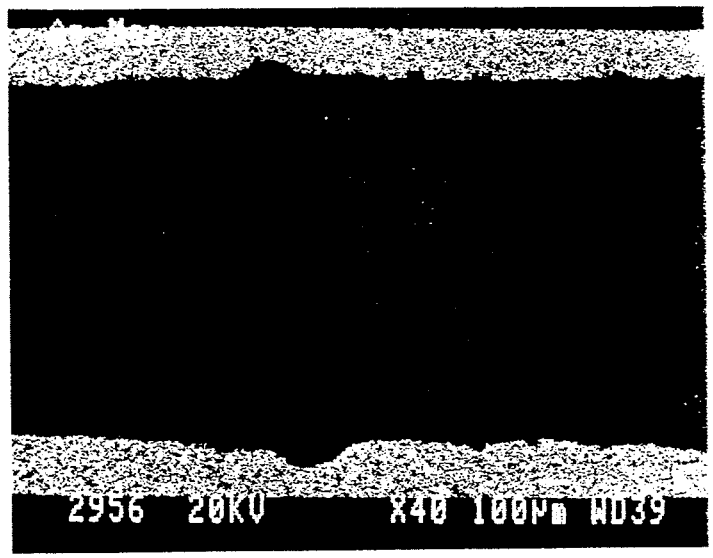
FIG. 14  EDS Map of Silver Distribution Within Composite (40X).

EFFICIENT INCORPORATION OF SILVER TO IMPROVE SUPERCONDUCTING FIBERS

This invention was made with Government support under a contract with the Department of Energy (DOE) and Ames Laboratory, Contract No. SC-91-225, our reference No. CRD-1272. The Government has certain rights in this invention.

BACKGROUND OF THE INVENTION

1. Field of the Invention

The present invention relates in general to the addition of a metal to a superconducting material for homogeneous dispersion of the metal therein, and in particular to a new and improved method for adding silver to a superconducting material to increase the strain tolerance and conductivity thereof in the design and fabrication of magnets and similar products based on the high temperature superconducting material.

2. Description of the Related Art

In the design and fabrication of large scale magnets based on the high temperature superconducting materials, the strain tolerance of the conductor plays an important role. The cuprate superconductors by themselves have a strain tolerance that withstands only about 0.1% to 0.2% strain making fabrication of the magnet exceedingly difficult.

One way to fabricate a highly strain tolerant material is to make a microfilamentary composite based on discontinuous filaments. The filaments are separated from one another by a ductile material so that some plastic flow is possible within the matrix without breaking the superconducting filaments. One possible design is to have filaments of superconducting $Bi_2Sr_2Ca_1Cu_2O_{8-\delta}$ in a silver (Ag) matrix. In the design of such a matrix, it is important that the normal barriers between filaments be thin compared to the supercurrent decay length of Cooper paris in silver or about 20 nanometers (nm), see T. Y. Hsiang and D. K. Finnemore, Phys. Rev. B 22,154 (1980) In addition, the length to diameter ratio of the superconducting filaments should be on the order of 10,000 to 1 so that there is enormous overlap area between filaments. As a consequence, the filament-to-filament current density can be low. With this aspect ratio, the conductor will have an effective resistivity in the range of $10^{-14}$ ohms ($\Omega$) centimeter (cm) even if the silver barriers are totally normal.

Silver additions to superconducting materials have been demonstrated to have several benefits for improved superconductor performance in addition to promoting strain tolerance in the structure. These benefits appear to be related to the promotion of a controlled crystallographic orientation in the material. This structural improvement can lead to performance enhancements such as high-temperature shift of the zero resistivity temperature ($T_C$), and an increase in critical current density ($J_C$), as described in the article by Y. Matsumoto, et al, "Origin of the Silver Doping Effects on Superconducting Oxide Ceramics", Appl. Phys. Lett. 56(16), 1585 (1990).

The general idea of using silver to provide regions of plastic flow and using overlap areas of the superconducting filaments to overcome the weak link problem seems very promising but it has been difficult to fabricate composites having the desired geometry. Various methods have been used to make $Bi_2Sr_2Ca_1Cu_2O_{8-\delta}$/Ag composites. In possibly the most straight forward and successful approach, Sato, et al, IEEE Trans. Magn. MAG-27, 1231 (1991), has demonstrated that a multifilamentary conductor composed of 123 monolithic ribbons in a composite degrade only about 30% with a bending strain of about 0.7%. For these samples, there is a high degree of texturing and considerable anisotropy in $J_C$.

Other attempts to form high $T_C$ superconducting wire with a high strain tolerance has used the "powder in a tube" approach. However, these efforts have met with modest success. In this case, silver was dispersed through the matrix by micro-milling powders followed by composite consolidation using various metal working steps. An important requirement for this technique to be successful is that the particle size of the powders be exceedingly fine. This is necessary so that the subsequent sintering process yields an integral superconducting structure.

A reliable means of dispersing silver within the superconducting composite has not been described in literature. Current methods are time-consuming involving several process steps to incorporate the silver within the structure. In addition, obtaining a homogenous distribution of silver has proven difficult.

Thus, there is a need for a processing technique for efficient incorporation of silver in a superconducting material to increase the strain tolerance of the conductor to make it suitable for use in large scale magnets.

SUMMARY OF THE INVENTION

The present invention solves the aforementioned problems with the prior art as well as others by providing a method for homogeneously dispersing a metal in a superconductor material (a term which includes both calcined superconductor oxides or non-calcined superconductor precursors). A predetermined amount of a metal is blended with a superconductor powder and placed in a heating assembly. The blend is melted and a stream of the melted blend is dropped into a special nozzle. A gas blown through the nozzle transforms the melted blend into ligaments which cool and solidify in the barrel to form fibers with improved flexibility for subsequent processing and having a metal homogeneously dispersed therein.

The present invention is also directed to a method for fabricating a high strain tolerant superconducting material comprising the steps of blending a predetermined amount of silver with a superconductor precursor powder and cold compacting this blend into at least one pellet. The pellet is charged into a preheated crucible assembly, melted and dropped in a stream of melted superconducting material into a vertically extending barrel. Gas is blown downwardly through the barrel at a sufficient rate to transform the melted blend in the barrel into fine ligaments which cool and solidify in the barrel to form flexible fibers. These flexible fibers are then collected.

An object of the present invention to provide an improved processing technique for the efficient incorporation of a metal in a superconducting material.

Another object of the present invention is to increase the strain tolerance of the conductor to greater than 1% which is suitable for use in large scale magnets that operate at 35K or higher.

A further object of the present invention is to provide a method which is less time consuming and disperses the metal uniformly within a superconducting matrix in an efficient, cost-effective method.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the drawings:

FIG. 6 is a photomicrograph of 5% silver-Bismuth 2212 fibers;

FIG. 7 is a photomicrograph of 11.5% silver-Bismuth 2212 fibers;

FIG. 8 is a photomicrograph of 23.5% silver-Bismuth 2212 fibers;

FIG. 9 is a photomicrograph of cold-compacted 11.5% silver-Bismuth 2212 material;

FIG. 10 is a photomicrograph of an X-ray dot map for silver;

FIG. 11 is a photomicrograph of fibers produced form non-calcined precursor containing 30 Wt. % Ag;

FIG. 12 is a photomicrograph of an energy dispersive spectroscopy (EDS) map of silver distribution within a composite;

FIG. 13 is a photomicrograph of a longitudinal section of a manufactured fibrous composite; and FIG. 14 is a photomicrograph of an EDS map of the silver distribution within FIG. 13.

DESCRIPTION OF THE PREFERRED EMBODIMENTS

Figure 1:
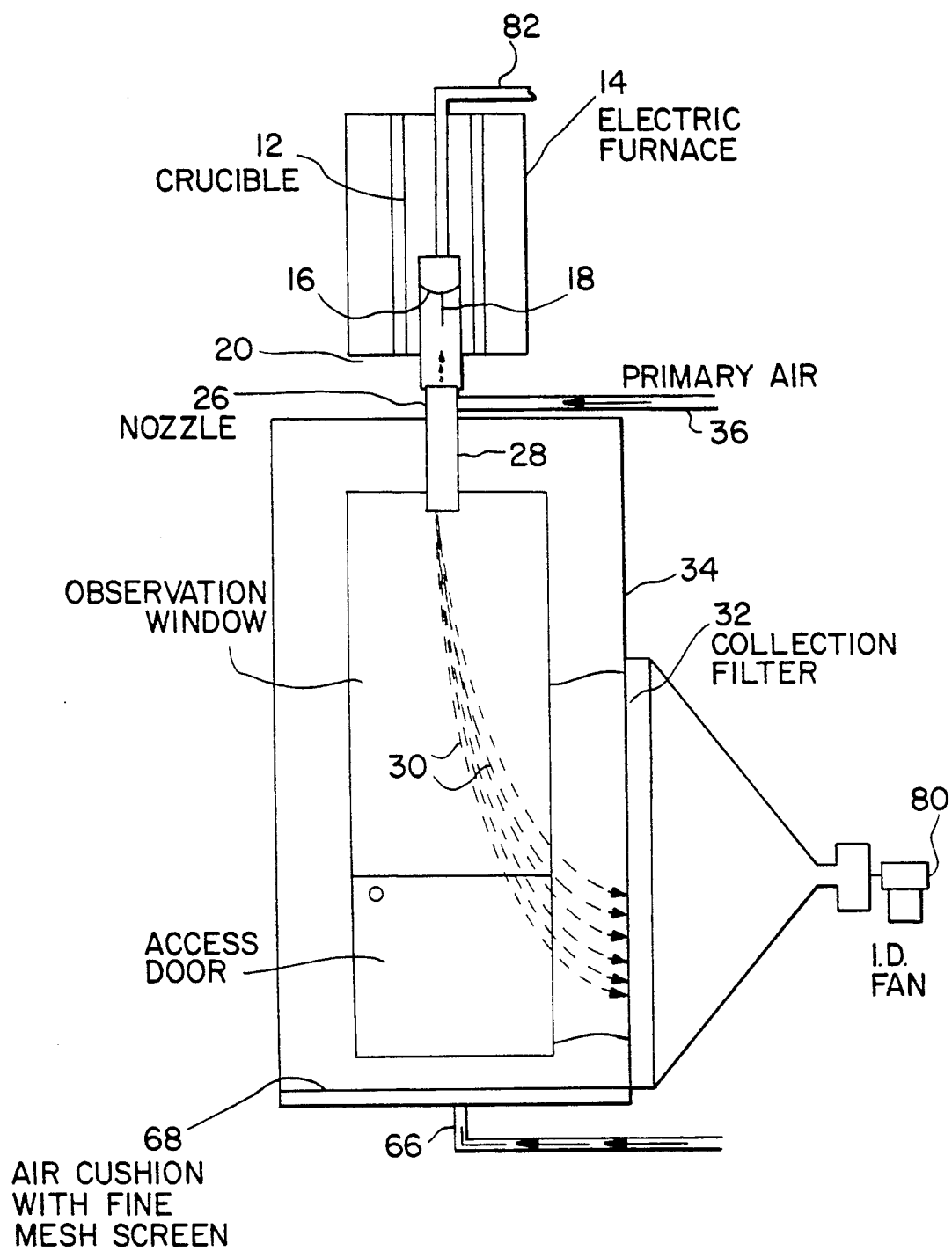
FIG. 1 is a schematic sectional view of an apparatus constructed for practicing the method of the present invention.

The present invention resides in an improved processing technique for the efficient incorporation of metal such as silver in a superconducting material. The term superconducting material as used herein is meant to include both calcined superconductor oxides and non-calcined superconductor precursors which can be mixtures of carbonates and oxides, or superconducting fibers as produced by gas jet fiberization. The term strain tolerance is meant to include the strain tolerance of the amorphous flexible fibers before heat treatment. Strain tolerance is also necessary in a composite wire or the final product made with the woven fibers or superconducting fibers as produced by gas jet fiberization. An important accomplishment in the present invention is the discovery that inexpensive, non-calcined superconductor precursors can be fiberized. These precursors cost much less than the calcined superconductor oxides. For example, a 2212 precursors containing BiO, $SrCO_3$, $CaCO_3$, and CuO costs $0.70 per gram as opposed to $1.40–$2.00 per gram for the calcined material. The fibers made with the present invention using superconductor precursors are "partially calcined" as a result of the melting during fiberization. This is an important cost savings in that otherwise these materials may require hundreds of hours of thermal treatment to accomplish the calcination step. This material does require additional thermal treatment to develop optimum superconducting properties.

One example of a suitable heat treatment of a final product made with the improved flexible fibers of the present invention includes the following treatment: Rapidly heating the product in a controlled atmosphere containing a prescribed amount of oxygen for example 70 mm of oxygen to about 850° C. and then slow heating it at about 10° C./min to about 880° C. This is immediately followed by cooling at about 1° C./minute to about 860° C. and holding for about 72 hours followed by rapid quenching such as furnace cooling to room temperature.

Amorphous materials are more difficult to predict melting temperatures than crystalline material. Also, the silver precipitates from the liquid during crystallization. One suitable final product is a wire made from a silver tube containing woven flexible fibers of the present invention and then heat treated in the above manner.

U.S. patent application Ser. No. 07/855,141 now U.S. Pat. No. 5,163,620 filed on Mar. 20, 1992, which is assigned to the assignee of the present invention and hereby incorporated by reference, describes a gas jet fiberization technique to prepare flexible high temperature superconductor (HTSC) $Bi_2Sr_2Ca_1Cu_2O_8$ fibers directly form the melt. In addition to providing flexible fibers, the advantage of this approach over commonly utilized powder sintering processes is that the material produced is for practical purposes amorphous with excellent ductility. Transformation of the amorphous product by crystallization via thermal treatment is precisely controlled. Therefore, better superconducting properties are reliably achieved. Also, much higher densities than achieved with conventional processing is observed for the fiber material. A higher integrity structure with better current transport properties is manufactured from such a starting stock material.

A key component of the fiberization process is the specially designed nozzle claimed in U.S. patent application Ser. No. 07/855,141 filed Mar. 20, 1992. This modified fiber blowing nozzle was developed specifically to match the thermal and fluid characteristics of the Bismuth-based superconductor melts in terms of the viscosity versus temperature and cooling characteristics of these materials. The significant feature of the nozzle design is that it induces a high velocity shear force into descending droplets so that fine fibers are stripped from the molten material. As a consequence, the nozzle produces thin fibers with length to diameter ratios in the range of 10,000 to 1.

To incorporate silver homogeneously and efficiently within the superconducting fibers, silver is blended with the high temperature superconductor (HTSC) precursor powders and is cold-compacted into pellets.

A better feed system was devised by consolidating the powder material into pellets prior to introduction into the crucible. The pelletized charge material provides more uniform and reliable melting characteristics. The dense pellet allows higher heat transfer rates and more rapid assimilation of the added charge into the molten pool. This in turn provides a more stable and consistent temperature condition within the crucible during the fiberization process. The use of pelletized charge materials allows continuous additions to be made to the melting system which demonstrates the potential for upscaling the fiberization process to a commercial operation.

The term silver is meant to include any compound containing silver like silver chloride (AgCl) for example. Also, while silver is specifically described, the present invention is applicable to any metal including but not limited to lead (Pb), palladium (Pd), and gold (Au). Referring to FIG. 1, the pellets are charged directly into a preheated crucible (12) assembly contained within an electric resistance furnace (14). This minimizes the occurrence of possible deleterious chemical reactions between the charge material and crucible (12), or loss of alloying constituents. An overpressure of an inert gas such as argon supplied along line (82) protects the molten bath from reaction with oxygen to maintain melt purity and to assist extrusion from a sealed crucible, for example, as in a lead-doped 2212 compound. The material blend is melted and heated sufficiently to ensure the melt is of uniform temperature prior to fiberization. A Bi 2212 superconductor material melts completely at 1650° F. (phase change). The melt, however, si superheated to 1720° F.–1740° F. to reduce viscosity down to about 1 poise. The material is melted and heated up to 100° F. above its melting point sufficiently to ensure that the melt is of uniform temperature prior to fiberization. Only after the higher temperature was reached, a plug (not shown) in the opening (16) is removed to initiate the stream (18). If flows freely at (18) from a small hole (16) at the bottom of the alumina crucible (12). The melt initially forms a continuous stream which breaks up into separate droplets (20) due to viscosity considerations and other velocity-related factors. The droplets (20) fall through a high temperature ceramic tube (22) which stabilizes the stream and minimizes any turbulance. The droplets (20) then enter the blowing nozzle (26) where it is impinged by a high velocity gas stream supplied by line (36) connected to a gas supply. The gas enters the chamber in the horizontal section (50) of the nozzle (26) while the droplets (20) move in a vertical direction.

Figure 2:
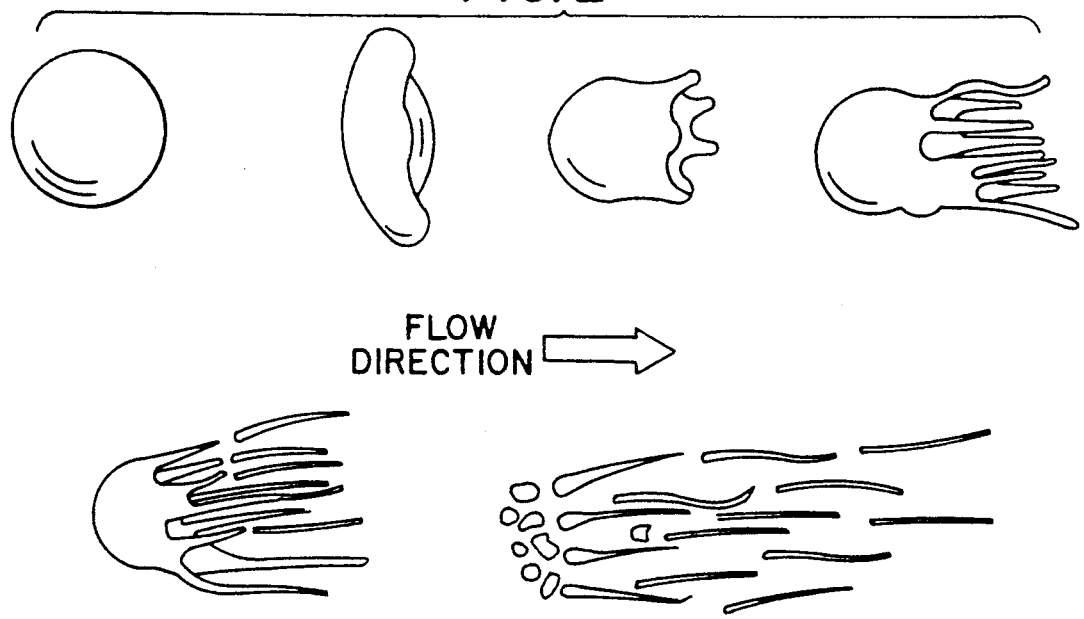
FIG. 2 is a time elapse, composite view of how a droplet deforms under the influence of a gas stream in a barrel of the blowing nozzle.
Figure 3:
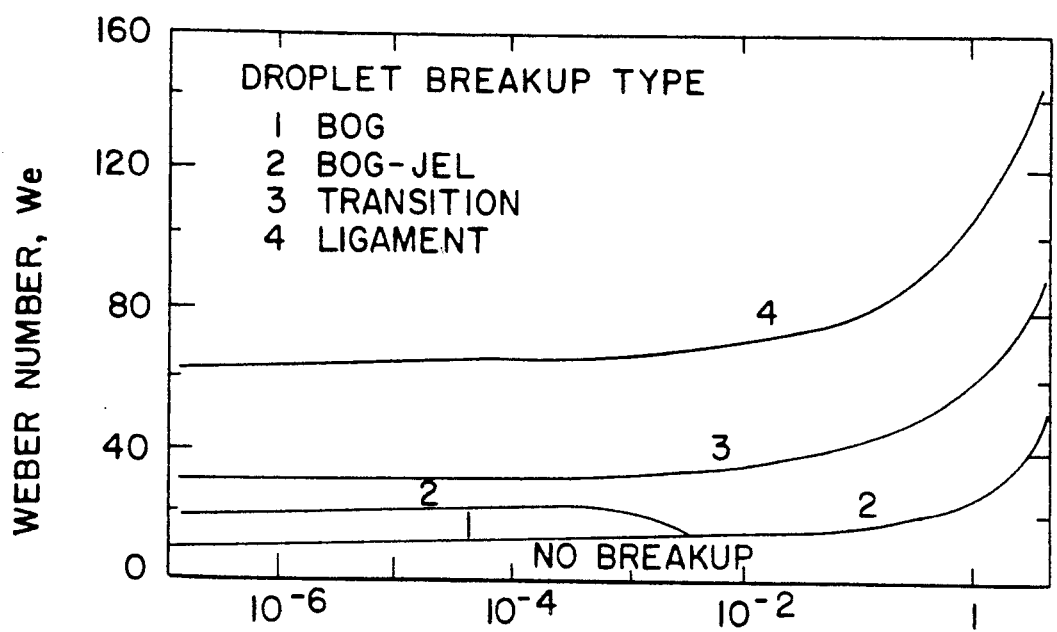
FIG. 3 is a graph plotting the inverse of a LaPlace number against the Weber number for droplet breakup mechanisms.
Figure 4:
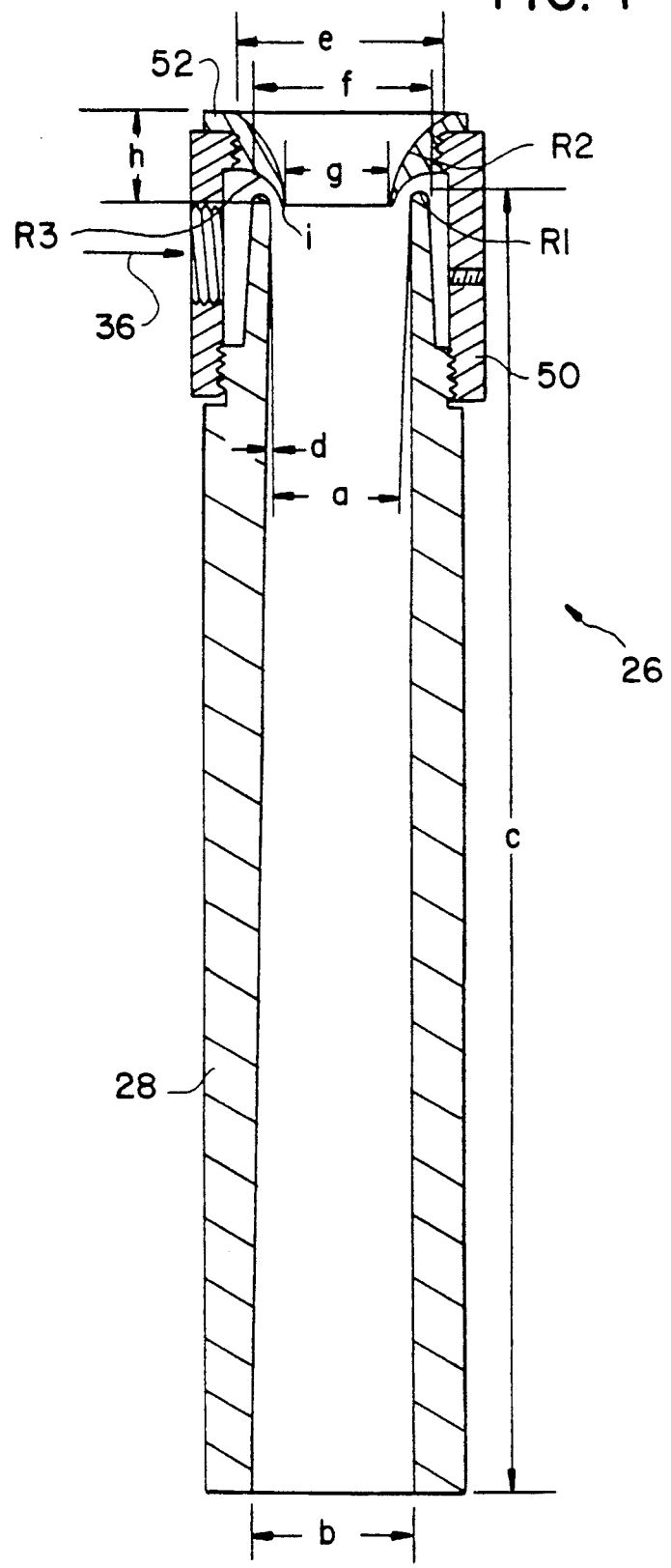
FIG. 4 is a sectional view of the nozzle employed with the method of the present invention.
Figure 5:
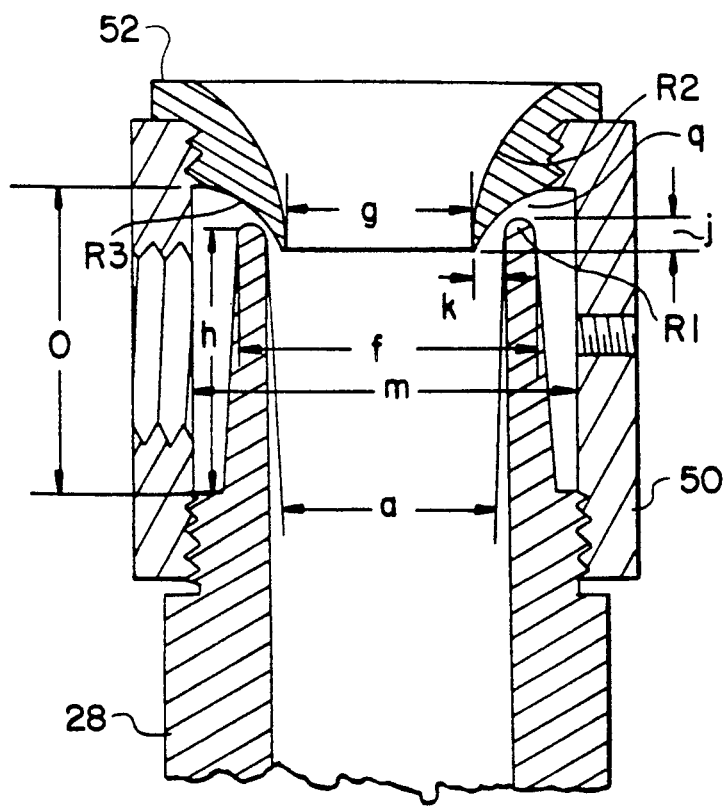
FIG. 5 is a partial sectional view of the nozzle on an enlarged scale.

The high velocity gas in the fiber blowing nozzle (26) causes tremendous shear forces on the droplets (20) which mechanically force the melt into fine ligament segments as illustrated in FIG. 2. These ligaments and other partially solidified material continue to undergo further shearing and cooling within the barrel (28) of the nozzle (26). This causes elongation of the ligaments and the final product upon complete solidification are long and slender flexible fibers of superconducting material containing up to 40% (on a weight percent basis) silver. Incomplete transformation of the molten droplets (20) produces small flakes and spherical shot particles. The fiberized material is collected downstream in a vented collecting chamber (34). A fan (80) and/or a secondary nozzle (66) directs the flexible fibers (30) against a collection filter (32). The secondary nozzle (66) provides an air cushion above a fine mesh screen (68) positioned across the bottom of the collecting chamber (34). This assists in the fiber collecting process and prevents any debris from blocking the secondary nozzle (66).

The blown silver-containing superconducting fibers are then cleaned to separate out any waste material. The clean fibers are then consolidated by a variety of methods known in the art including hot-pressing, packing in a tube followed by swagging or rolling operations as well as many other conventional material consolidation process to form composite wire, magnets, or other suitable devices from the silver containing superconducting material. The compacted high temperature superconductor/silver composite is the heat-treated in a controlled manner to achieve superconducting properties.

Table I shows the inductively coupled plasma (ICP) spectroscopy chemical analysis and relative moles several examples of differing percents on a weight percent basis of HTSC/Ag composite flexible fibers fabricated with the method of the present invention. Tables II, III and IV set forth experimental parameters of representative samples. FIGS. 6–8 show photomicrographs of the produced fibers. FIG. 9 shows a cold compacted 11.5% Ag-2212 material fabricated with the method of the present invention. The silver content was verified by X-ray dot map as shown in FIG. 10.

TABLE I

| ICP Chemical Analysis of Silver-Containing Fibers | | | | | | |
|---|---|---|---|---|---|---|
| | Weight Percentages | | | | | B & W |
| Sample | Silver | Bismuth | Calcium | Copper | Strontium | Sample ID# | Identification |
| 1 | 4.305 | 45.54 | 3.009 | 14.49 | 18.60 | 1 | HT5551-107 |
| 2 | 8.015 | 53.26 | 3.583 | 13.56 | 17.70 | 2 | HT5553-109C |
| 3 | 8.854 | 42.21 | 3.498 | 13.47 | 17.61 | 3 | HT5553-109B |
| 4 | 6.974 | 43.56 | 3.361 | 13.88 | 18.08 | 4 | HT5553-109A |
| 5 | 4.551 | 45.51 | 3.078 | 14.31 | 18.28 | 5 | HT5550-106 |
| 6 | 12.480 | 41.33 | 3.391 | 13.00 | 17.14 | 6 | HT5554-110 |
| 7 | 2.774 | 47.90 | 4.301 | 14.35 | 15.46 | 7 | HT5543-99 |
| 8 | 3.974 | 45.00 | 4.004 | 14.17 | 16.47 | 8 | #80 Fiber |
| 9 | 2.801 | 48.04 | 3.918 | 14.47 | 17.17 | 9 | #100 Fiber |
| 10 | 2.874 | 47.98 | 3.841 | 14.59 | 17.27 | 10 | #100 Shot & Fiber |
| 11 | 2.995 | 48.14 | 4.237 | 14.55 | 15.93 | 11 | #101A Fiber |
| 12 | 5.762 | 44.17 | 3.520 | 13.41 | 19.66 | 12 | #101B Fiber |
| 13 | 4.066 | 45.86 | 3.941 | 14.35 | 18.21 | 13 | #106 Fiber |
| 14 | 11.880 | 41.58 | 4.369 | 13.68 | 17.05 | 14 | #105 Shot & Fiber |
| Average | — | 45.7 ± 3.1 | 3.72 ± 0.42 | 14.0 ± 0.5 | 17.5 ± 1.1 | | |
| 15 | 0.004 | 44.79 | 4.301 | 14.13 | 19.05 | 15 | SCI Lot #M50 |
| | Relative Moles | | | | | |
| | Sample | Silver | Bismuth | Calcium | Copper | Strontium |
| | 1 | 0.0399 | 0.2179 | 0.0751 | 0.2280 | 0.2123 |
| | 2 | 0.0743 | 0.2549 | 0.0894 | 0.2134 | 0.2020 |
| | 3 | 0.0821 | 0.2020 | 0.0873 | 0.2120 | 0.2010 |

TABLE I-continued

| ICP Chemical Analysis of Silver-Containing Fibers | | | | | | |
|---|---|---|---|---|---|---|
| | 4 | 0.0647 | 0.2084 | 0.0839 | 0.2184 | 0.2063 |
| | 5 | 0.0422 | 0.2178 | 0.0768 | 0.2252 | 0.2086 |
| | 6 | 0.1157 | 0.1978 | 0.0846 | 0.2046 | 0.1956 |
| | 7 | 0.0257 | 0.2292 | 0.1073 | 0.2258 | 0.1764 |
| | 8 | 0.0368 | 0.2153 | 0.0999 | 0.2230 | 0.1880 |
| | 9 | 0.0260 | 0.2299 | 0.0978 | 0.2277 | 0.1960 |
| | 10 | 0.0266 | 0.2296 | 0.0958 | 0.2296 | 0.1971 |
| | 11 | 0.0278 | 0.2304 | 0.1057 | 0.2290 | 0.1818 |
| | 12 | 0.0534 | 0.2114 | 0.0878 | 0.2110 | 0.2244 |
| | 13 | 0.0377 | 0.2194 | 0.09833 | 0.2258 | 0.2078 |
| | 14 | 0.1101 | 0.1990 | 0.1090 | 0.2153 | 0.1946 |
| | 15 | 0.0000 | 0.2143 | 0.1073 | 0.2224 | 0.2174 |

TABLE II

| | | Experimental Parameters | | | |
|---|---|---|---|---|---|
| Run # | Material | Maximum Temperature (°C.) | Other Conditions | Fiber Yield (%) | Comments |
| 5528-84 | SCC 2212 Recycled "shot" material from previous run. | 910 | Air pressure 20 psi primary 10 psi secondary | 16 | Nozzle opening was adjusted but the fiber quality did not improve. The fiber contained a lot of shot material. At one point, vigorous boiling was observed within the molten bath. |
| 5529-85 | SCC 2212 | 920 | Air pressure 20 psi primary 0.5 psi secondary | 9 | A lower secondary air pressure was employed to increase fiber/shot separation. Nozzle setting and drop distance from the crucible (47 cm) was identical to the previous run; fiber quality was about the same as well. |
| 5530-86 | SCC 2212 | 915 | Air pressure 20 psi primary 0.5 psi secondary Air stream heated to 220° C. | 14 | A heated air stream was used for the first time in this experiment to fiberize the superconductor material. The use of heated air dramatically. In addition, the morphology of the "waste" material was altered from spherical shot to flat flakes. |
| 5531-87 | SCC 2212 | 910 | Air pressure 20 psi primary 0.5 psi secondary Air stream heated to 260° C. | 14 | The melt stream flowed erratically from the crucible into the fiberization nozzle. This problem may have reduced the product yield and increased the amount of flakes produced. |

TABLE III

| | | Experimental Parameters | | | |
|---|---|---|---|---|---|
| Run # | Material | Maximum Temperature (°C.) | Other Conditions | Fiber Yield (%) | Comments |
| 5554-110 | SCC 2212 + 41 wt. % Ag | 955 | Air pressure 20 psi primary 101 SCFM 20 psi secondary Air stream heated to 95° C. | 10 | In this run, 2212 superconductor material containing a high percentage of silver was fiberized. In spite of the 40 wt. % of Ag content, no evidence was observed that the silver separated in the melt. The product quality was good although it did contain a lot of flake particulate. |
| 5553-109A | SCC 2212 + 30 wt. % Ag | 950 | Air pressure 20 psi primary 101 SCFM 20 psi secondary Air stream at 20° C. | 11 | The silver/2212 mixed and compacted pellets were heat treated prior to fiberization. This treatment at 810° C. for 18 hours was performed to better homogenize the mixture to decrease the tendency for melt segregation. Melting was observed during the run from 915 to 950° C. Good quality fiber was produced in this run with very little flake material observed. |
| 5553-109B | SCC 2212 + 30 wt. % Ag | 945 | As above except the air stream was heated to 60° C. | 11 | This experiment replicated the previous one with the exception that heated fiberization air was used. Fiber quality for this run was very similar to that found in |

TABLE III-continued

| Run # | Material | Experimental Parameters | | Fiber Yield (%) | Comments |
|---|---|---|---|---|---|
| | | Maximum Temperature (°C.) | Other Conditions | | |
| 5553-109C | SCC 2212 + 30 wt. % Ag | 955 | Air pressure 21 psi primary 90 SCFM 20 psi secondary Air stream heated to 130° C. | 8 | 109A. The experimental conditions for this run were similar to those of 109A and 109B. However, higher temperature, fiberization air was used to determine its influence on product yield and quality. About 15 grams of essentially pure silver was found to have separated out of the melt. The product from this run contained more flake than the previous two trials. In addition, product yield was reduced in this run. |

TABLE IV

| Run # | Material | Experimental Parameters | | Fiber Yield (%) | Comments |
|---|---|---|---|---|---|
| | | Maximum Temperature (°C.) | Other Conditions | | |
| 5557-113 | "Non-calcined" $Bi_2$—$Sr$—$_{2.4}$—$Ca_{1.2}$—$Cu_2$ | 920 | Air pressure 20 psi primary 101 SCFM 20 psi secondary Air heated to 95° C. | 25 | Non-calcined superconductor material was used as feedstock in this run. This mixture of CuO, $SrCO_3$, BiO, and $CaCO_3$ costs much less than the fully calcined material. A high product yield was obtained in this run. A lot of flake was produced as well. |
| 5558-114 | "Non-calcined" $Bi_2$—$Sr$—$_{2.4}$—$Ca_{1.2}$—$Cu_2$ | 890 | Air pressure 20 psi primary 101 SCFM 20 psi secondary Air heated to 65° C. | 27 | This experiment was similar to the previous one except that a lower melt temperature and lower air temperature was used to reduce the amount of flake in the product. The superconductor material apparently only partially melted at 890° C., about 20% of the charge melted at about 925° C. This incongruent melting behaviour may have produced chemically inhomogeneous fibers. Fiber quality and yield for this run was similar to 5557-113. |
| 5559-115 | "Non-calcined" $Bi_2$—$Sr$—$_{2.4}$—$Ca_{1.2}$—$Cu_2$ + 30 wt. % Ag | 955 | Air pressure 20 psi primary 101 SCFM 20 psi secondary Air temperature 18° C. | 16 | Non-calcined Bi—Sr—Ca—Cu material was mixed with silver to use as feedstock for this run. The mixture method melted over a range of 900 to 955° C. The molten material appeared to be very viscous which caused problems maintaining a uniform flow into the nozzle. The silver addition raised the melt temperature and lowered the product yield. Fiber quality was also decreased. |

The use of the silver incorporation method of the present invention provides the following advantages over standard powder press and sintering processing methods. First, there is a homogeneous distribution of silver within the superconductor. Secondly, the superconductor/silver mixture is refined through melting which disassociates residual carbonates used to produce most HTSC materials and intimately mixes the silver within the melt. Additionally, there is not strict requirement for the particle size of the silver alloy material employed. Thirdly, a microcrystalline structure is produced with a fine distribution of silver. Such a combination results in improved mechanical strength and more robust performance for a superconducting composite manufactured from the HTSC/Ag flexible fibers. Fourthly, large concentrations of silver of up to about 40% (on a weight percent basis) can be incorporated into the superconductor. Finally, the method of the present invention is less time-consuming than standard procedures currently used particularly in that considerable time is not required to mix the silver in the high temperature superconductor.

The use of silver oxide additions incorporated in HTSC fibers alter favorably oxygen stoichiometry for enhanced superconducting performance. Also, the use of a silver compound such as silver chloride (AgCl) to function as a melt flux protects the material during processing and acts as a dopant for improvement in the superconducting properties of oxide ceramics. Lastly, the use of silver and silver compounds in gas jet fiberization or other thermal process improves superconducting properties in oxide ceramics other than Bi-Sr-Ca-Cu-O system described here. These other applications include systems of interest such as Y-Ba-Cu-O, Tl-Ba-Ca-Cu-O and those systems containing lead (Pb) additions.

Even though the silver incorporation method is described as an efficient means to add silver to superconducting materials, the process is also suitable for obtaining homogeneous distribution of alloy elements for performance improvements in a variety of metallic and nonmetallic fiber components. Such fibers could form the basis for high performance composite articles which have broad application in a variety of industries.

While specific embodiments of the invention have been shown and described in detail to illustrate the application of the principles of the invention, it is understood that the invention may be embodied otherwise without departing from such principles.

We claim:

1. A method for fabricating flexible fibers of a high strain tolerant superconducting material, comprising the steps of:
   blending a predetermined amount of silver with a superconductor precursor powder;
   cold-compacting the blend into at least one pellet;
   charging the at least one pellet into a preheated crucible assembly;
   melting the at least one pellet in the crucible;
   dropping a stream of the melted blend into a vertically extending nozzle;
   blowing gas downwardly through the nozzle at a sufficient rate to transform the melted blend in the nozzle into fine ligaments which cool and solidify in a barrel of the nozzle to form flexible fibers; and
   collecting the fibers.

2. A method according to claim 1, further comprising the step of supplying an overpressure of an inert gas to the melted blend.

3. A method according to claim 2, wherein the inert gas is argon.

4. A method according to claim 1, wherein up to about forty percent silver is blended with the superconductor precursor powder.

5. A method according to claim 1, wherein the gas is a member selected form the group consisting of air, steam, nitrogen, argon and helium.

6. A method according to claim 1, wherein the superconducting material is a high temperature superconducting ceramic (HTSC) material.

7. A method according to claim 6, wherein the superconducting material comprises a Bi based superconducting material.

8. A method according to claim 7, wherein the superconducting material comprises a formula $Bi_2Sr_2Ca_1Cu_2O_8$.

9. A method according to claim 1, including superheating the melted blend after it is melted and before it is dropped in the stream for decreasing the viscosity thereof.

10. A method according to claim 9, further including the step of melting the blend in the furnace and dropping the stream of the melted blend in a collar in the furnace to maintain its temperature before the stream reaches the nozzle, the nozzle being outside the furnace.

11. A method according to claim 10, further including the step of maintaining a pressure of gas in the nozzle at between about 20 and 30 psig.

12. A method according to claim 1, further including the step of adjusting the rate of gas flow blowing downwardly in the barrel to form fibers having a diameter of from about 1 to 10 microns and a length-to-diameter ratio of from about 1,000 to 10,000.

13. A method for homogeneously dispersing a metal in a superconductor material, comprising the steps of:
   blending a predetermined amount of a metal with a superconductor powder;
   placing the blend in a heating assembly;
   melting the blend in the heating assembly;
   dropping a stream of the melted blend into a nozzle;
   blowing gas through the nozzle at a sufficient rate to transform the melted blend in the nozzle into ligaments which cool and solidify in a barrel of the nozzle to form fibers with improved flexibility for subsequent processing and having a metal homogeneously dispersed therein; and
   collecting the fibers.

14. A method according to claim 13, further comprising the step of consolidating the blend into at least one pellet prior to the placing step.

15. A method according to claim 13, further comprising the step of supplying an overpressure of an inert gas to the melted blend.

16. A method according to claim 13, wherein the metal is a member selected from the group consisting of lead, silver, palladium, and gold.

17. A method according to claim 13, wherein the superconductor material comprises a Bi based superconducting material.

18. A method according to claim 13, further including superheating the melted blend after it is melted and before it is dropped in the stream for decreasing the viscosity thereof.

* * * * *